(12) United States Patent
Gu

(10) Patent No.: US 11,563,190 B2
(45) Date of Patent: Jan. 24, 2023

(54) GRAPHENE-BASED PHOTODETECTOR

(71) Applicant: Huanhuan Gu, Ottawa (CA)

(72) Inventor: Huanhuan Gu, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 17/116,674

(22) Filed: Dec. 9, 2020

(65) Prior Publication Data
US 2022/0181570 A1 Jun. 9, 2022

(51) Int. Cl.
*H01L 51/44* (2006.01)
*H01Q 1/22* (2006.01)
*H01L 27/30* (2006.01)
*H01L 31/0224* (2006.01)
*H01L 29/16* (2006.01)
*H01L 29/66* (2006.01)
(Continued)

(52) U.S. Cl.
CPC .......... *H01L 51/444* (2013.01); *H01L 27/307* (2013.01); *H01L 29/1606* (2013.01); *H01L 29/66015* (2013.01); *H01L 31/022408* (2013.01); *H01L 31/1126* (2013.01); *H01L 31/1129* (2013.01); *H01L 51/428* (2013.01); *H01Q 1/2283* (2013.01)

(58) Field of Classification Search
CPC . H01L 51/444; H01L 27/307; H01L 29/1606; H01L 29/66015; H01L 31/022408; H01L 31/1126; H01L 31/1129; H01L 51/428; H01L 31/036; H01L 31/09; H01Q 1/2283; H01Q 1/368
See application file for complete search history.

(56) References Cited

U.S. PATENT DOCUMENTS

| 9,293,627 B1* | 3/2016 | Beechem, III .... H01L 29/66015 |
| 2009/0009154 A1* | 1/2009 | Morf ........................ H01L 31/08 324/76.19 |

(Continued)

FOREIGN PATENT DOCUMENTS

| CN | 104916732 A | 9/2015 |
| CN | 106374006 A | 2/2017 |

(Continued)

OTHER PUBLICATIONS

Diego Correas-Serrano et al., Graphene-based Antennas for Terahertz Systems: A Review, Forum for Electromagnetic Research Methods and Application Technologies (FERMAT), pp. 1-26, Apr. 2017. (Year: 2017).*

(Continued)

*Primary Examiner* — S M Sohel Imtiaz

(57) ABSTRACT

Various graphene-based photodetectors are disclosed. An example photodetector device may include: a substrate; a first antenna component fabricated on the substrate, the first antenna component comprising one or more antenna electrodes; a second antenna component fabricated on the substrate, the second antenna component comprising one or more antenna electrodes; a source region coupled to the first antenna component and the substrate; and a drain region coupled to the second antenna component and the substrate; wherein the one or more antenna electrodes in the first antenna component and the second antenna component are made of graphene.

19 Claims, 15 Drawing Sheets

(51) Int. Cl.
*H01L 31/112* (2006.01)
*H01L 51/42* (2006.01)

(56) References Cited

U.S. PATENT DOCUMENTS

| | | | | |
|---|---|---|---|---|
| 2013/0286633 | A1* | 10/2013 | Rodriguez | H01L 33/50 362/84 |
| 2015/0084002 | A1* | 3/2015 | Song | H05K 1/09 257/29 |
| 2016/0323041 | A1* | 11/2016 | Akyildiz | H04B 10/90 |
| 2017/0301819 | A1* | 10/2017 | Yao | H01L 31/028 |
| 2017/0310907 | A1* | 10/2017 | Wang | G02B 1/002 |
| 2019/0296158 | A1* | 9/2019 | Falk | B82Y 15/00 |
| 2020/0264048 | A1* | 8/2020 | Jarrahi | G01J 3/108 |

FOREIGN PATENT DOCUMENTS

| | | |
|---|---|---|
| CN | 110767769 A | 2/2020 |
| WO | 2019074441 A1 | 4/2019 |

OTHER PUBLICATIONS

Jarrahi, M., "New Frontiers in Terahertz Technology" 2015.
Suzuki, D., et al., "Thermal Device Design for a Carbon Nanotube Terahertz Camera" 2018, ACS Omega, 3, 3540-3547.
Suzuki, D., et al., "A Flexible and Wearable Terahertz Scanner" 2016, Nature Photonics, vol. 10, 809-814.
Lepeshov, S., et al., "Enhancement of Terahertz Photoconductive Antennas and Photomixers Operation by Optical Nanoantennas" 2017, Laser & Photonics Review.
Burford, N., et al., "Review of Terahertz Photoconductive Antenna Technology" 2017, Opt. Eng. 56(1).
Jadidi, M., et al., "Tunable Terahertz Hybrid Metal-Graphene Plasmons" 2015, Nano Lett, 15, 7099-7104.
Polat, E., et al., "Flexible Graphene Photodetectors for Wearable Fitness Monitoring" 2019,Sci. Adv., 5.
Konstantatos, G., et al., "Hybrid Graphene-Quantum Dot Phototransistors with Ultrahigh Gain" 2019, Nature Nanotechnology, vol. 7, 363-368.
Correas-Serrano, D., et al., "Graphene-Based Antennas for Terahertz Systems: A Review" 2017, FERMAT.
Yang, X., et al., "A Flexible Graphene Terahertz Detector" 2017, Appl. Phys. Lett., 111.
Suessmeier, C., et al., "Analysis of a Plasmonic Graphene Antenna for Microelectronic Applications" 2018, 43rd International Conference on Infrared, Millimeter, and Terahertz Waves.
Choi, G., et al., "Graphene-Assisted Biosensing Based on Terahertz Nanoslot Antennas" 2019, Scientific Reports.
Zhang, M., et al., "A Flexible, Scalable, and Self-Powered Mid-Infrared Detector Based on Transparent PEDOT: PSS/Graphene Composite" 2020, Carbon, 156, 339-345.
Jin Wang et al, Tunable 2H-TaSe2 room-temperature terahertz photodetector, Chin. Phys. B, vol. 28, total 5 pages. 2019.
Sergi Abadal et al, Graphene-based Terahertz Antennas for Area-Constrained Applications, total 5 pages. Jan. 11, 2018.

* cited by examiner

GRAPHENE-BASED PHOTODETECTOR

RELATED APPLICATIONS

This is the first patent application for the present disclosure.

TECHNICAL FIELD

The present application relates to photodetectors, and in particular to graphene-based photodetectors.

BACKGROUND

Advanced antenna technology, especially electromagnetic antenna technology at a frequency in the terahertz (THz) range can be used for imaging purposes, such as environmental sensing or medical imaging. A unit of THz is generally defined as one trillion ($10^{12}$) cycles per second or one trillion hertz. Fast, efficient and sensitive detection of light in the 0.1 to 10 THz frequency range by a photodetector is often needed for imaging applications. For example, detection of concealed weapons or other objects in security screening, detection of mechanical structure defects, and medical imaging applications for the purpose of medical diagnosis are all practical applications of THz photodetectors.

In addition, THz photodetectors may be relevant for wireless communication in the THz frequency range, which may provide rapid data transmission.

In general, a THz photodetector can detect a signal in the THz frequency range by transforming a received optical signal to electrical signals. Several techniques have been proposed to increase the optical-to-electrical conversion efficiency. For example, by optimizing the shape of electrodes, or adding nanostructure to the optical reception area, and so on.

FIG. 1 shows a carbon nanotube (CNT) detector 100 which can receive a THz irradiation and transforms the received energy from the THz irradiation to an electrical form. As explained in the Suzuki, D. et al. "Thermal Device Design for a Carbon Nanotube Terahertz Camera." *ACS Omega* 3 (2018): 3540-3547, which is incorporated herein by reference in its entirety, the high thermoelectric properties of carbon nanotube (CNT) films can lead to high-performance thermal THz detectors. Along with thermal gradient generated by THz irradiation, a THz response in the form of a voltage is generated. The highest THz responses may be generated at the interfaces between the CNT film and the source/drain electrodes.

FIG. 2 illustrates a schematic representation of a dipole photoconductive THz antenna 200. The THz antenna has a large gap with silver plasmonic monopole nanoantennas in the form of nanoislands. The fabrication of such monopole nanoantennas is done by thermal evaporation of silver (Ag), with subsequent deposition onto LT-GaAs antenna substrate surface. Silver in the hybrid THz-optical antenna is used due to the high quality factor of the silver nanostructures in the visible range, which allows achieving maximum localization of the field in the semiconductor surface layer in close proximity to a nanoantenna, with minimal losses, as discussed in Lepeshov, S., Krasnok, A., Krasnok, A., Rafailov, E., Belov, P., "Enhancement of terahertz photoconductive antenna operation by optical nanoantennas", *Laser & Photonics Reviews* 2017, 1600199, which is incorporated herein by reference in its entirety.

FIG. 3 illustrates an isometric view of a THz Photoconductive antenna (PCA) device 300 mounted on a high-resistivity float-zone silicon (HRFZ Si) lens, as discussed in Nathan M. Burford, Magda O. El-Shenawee, "Review of terahertz photoconductive antenna technology," Opt. Eng. 56(1) 010901 (24 Jan. 2017), which is incorporated herein by reference in its entirety. The device 300 includes a photoconductive substrate, THz dipole antenna electrodes, and HRFZ Si lens. The lateral dimension L may be in the range of a few millimeters to around a centimeter. THz waves are generated at the antenna dipole, at the focus of the optical input (e.g. an optical pump). The THz radiation propagates along the axis of the optical input, into the photoconductive substrate and then into air, with the majority propagating into the substrate. The HRFZ Si lens may couple with the generated THz radiation and propagate the radiation into free space.

The photodetectors in FIGS. 1 to 3 are however too bulky or too inflexible to be used as a wearable device. A thinner, more flexible photodetector is desired.

SUMMARY

The present disclosure describes several embodiments of a graphene-based photodetector and a system comprising the graphene-based photodetector. In accordance to some aspects, an example photodetector device may include: a substrate; a first antenna component fabricated on the substrate, the first antenna component comprising one or more antenna electrodes; a second antenna component fabricated on the substrate, the second antenna component comprising one or more antenna electrodes; a source region coupled to the first antenna component and the substrate; and a drain region coupled to the second antenna component and the substrate; wherein the one or more antenna electrodes in the first antenna component and the second antenna component are made of graphene. Compared to the conventional photodetectors, the graphene antenna may have a smaller and thinner structure (e.g. 33% smaller) that enables the disclosed photodetector to be worn on human bodies without inconveniencing the users. Further, when applied with different bias voltage, the resonance of the disclosed photodetector can be tuned at a wide frequency range.

In some example embodiments, the first antenna component and the second antenna component substantially form a bowtie shape.

In some example embodiments, the first antenna component and the second antenna component substantially form a spiral shape.

In some example embodiments, a gap may be disposed between the first antenna component and the second antenna component.

In some example embodiments, the device may be configured to receive optical light via the gap between the first antenna component and the second antenna component; and generate a current in the substrate as a result of receiving the optical light.

In some example embodiments, the one or more antenna electrodes in the first antenna component and the second antenna component cause excitement or propagation of plasmon waves between the source region and the drain region.

In some example embodiments, the wavelength of the optical light may be in a frequency range from about 0.1 THz to 10 THz.

In some example embodiments, the device may further include: a gate region disposed between the drain region and the source region.

In some example embodiments, the substrate may be a semiconductor substrate.

In some example embodiments, the substrate may include a top layer and a base layer underneath the top layer.

In some example embodiments, the top layer may include one or more material selected from: graphene, silicon, aluminum, silver, gold, gallium, indium, and germanium.

In some example embodiments, the top layer may include a material made of a metal oxide selected from: aluminum oxide, and silicon oxide.

In some example embodiments, the substrate may be a photoconductive substrate.

In some example embodiments, the base layer may include a material made of silicon.

In some example embodiments, the device may further include: a power detector configured to detect a voltage difference between the drain region and the source region.

In some example embodiments, the first antenna component and the second antenna component may have a combined length that is equal to or less than half of a wavelength of surface plasmon polaritons (SPPs) supported by the first antenna component and the second antenna component.

In some example embodiments, the first antenna component may have a length that is equal to or less than ¼ of the wavelength of the SPPs supported by the first antenna component.

In some example embodiments, the second antenna component may have a length that is equal to or less than ¼ of the wavelength of the SPPs supported by the second antenna component.

In some example embodiments, a thickness of the first antenna component may be less than 5 nanometres (nm).

In some example embodiments, a thickness of the second antenna component may be less than 5 nm.

In accordance to another aspect, there is disclosed a system having a plurality of photodetector devices arranged in one or more arrays to detect a metal object, where each photodetector device may include: a substrate; a first antenna component fabricated on the substrate, the first antenna component comprising one or more antenna electrodes; a second antenna component fabricated on the substrate, the second antenna component comprising one or more antenna electrodes; a source region coupled to the first antenna component and the substrate; and a drain region coupled to the second antenna component and the substrate; wherein the one or more antenna electrodes in the first antenna component and the second antenna component are made of graphene.

In some embodiments, the system may include a power detector coupled to at least one of the plurality of photodetector devices, wherein the power detector is configured to detect a voltage difference between the drain region and the source region of the at least one of the plurality of photodetector devices.

BRIEF DESCRIPTION OF THE DRAWINGS

Reference will now be made, by way of example, to the accompanying figures which show example embodiments of the present application, and in which.

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

Figure 1:
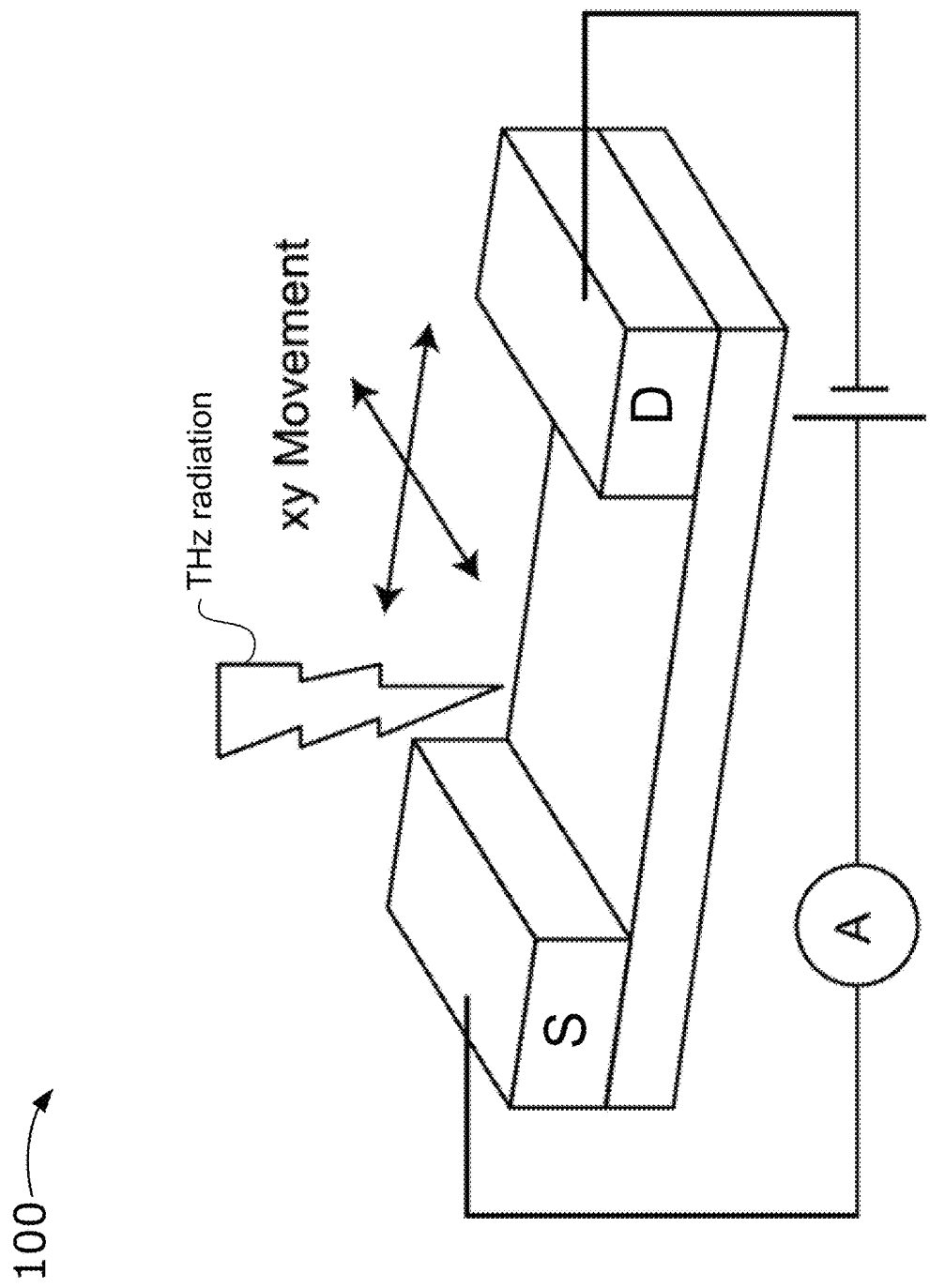
FIGS. 1 to 5 each illustrates a prior art photodetector.

Throughout this disclosure, the term "coupled" may mean directly or indirectly connected, electrically coupled, or operably connected; the term "connection" may mean any operable connection, including direct or indirect connection. In addition, the phrase "coupled with" is defined to mean directly connected to or indirectly connected through one or more intermediate components. Such intermediate components may include both or either of hardware and software-based components.

Further, a communication interface may include any operable connection. An operable connection may be one in which signals, physical communications, and/or logical communications may be sent and/or received. An operable connection may include a physical interface, an electrical interface, and/or a data interface.

Graphene is an allotrope of carbon consisting of a single layer of atoms arranged in a two-dimensional honeycomb lattice, which means it can be very thin, such as 0.34 nm. Graphene can be grown over large areas by chemical vapor deposition (CVD) and subsequently transferred to any substrate. Graphene also possesses a high intrinsic carrier mobility, high conductivity, and gapless spectrum. In addition, semiconductor quantum dot can be coated on top of a graphene layer to increase the photo absorption and therefore conversion efficiency. Further, due to its flexibility and transparency, graphene can be used to make wearable devices.

Graphene has good conductivity at THz frequency as the surface wave is of the plasmonic form. Plasmons are collective electron oscillations usually excited at metal surfaces by a light source, such as an optical pump. When the plasmons are resonant at the metal surface of graphene, a strong electric field can be induced which could enhance the generation of electron-hole pairs in the graphene layer, as described in Jadidi, M. M.; Sushkov, A. B.; Myers-Ward, R. L.; Boyd, A. K.; Daniels, K. M.; Gaskill, D. K.; Fuhrer, M. S.; Drew, H. D.; Murphy, T. E. (2015). "Tunable Terahertz Hybrid Metal-Graphene Plasmons". *Nano Letters.* 15 (10): 7099-104, which is herein incorporated by reference in its entirety.

Graphene-based field effect transistor (FET) can generate 2D plasmon waves between the source region and the drain region, and has been proposed to be used to build THz detectors. The gate, source and drain electrodes in this case can be metal and can be optimized for reception of signal at particular frequencies.

Graphene can also be used to make photodetector antenna. Moreover, the electrodes can be biased at different voltages so to change its conductivity and therefore its resonant behavior. In addition, being transparent and flexible, graphene may be used a viable material for wearable sensors. In particular, graphene sensitized with semiconducting quantum dot photodetectors (PDs) may offer benefits such as broadband wavelength sensitivity (e.g., 300 to 2000 nm) and high responsivity due to a built-in photoconductive gain, as described in Polat E O, et al., "Flexible Graphene Photodetectors for Wearable Fitness Monitoring", Sci Adv. 2019 Sep. 13, which is herein incorporated by reference in its entirety.

Figure 4:
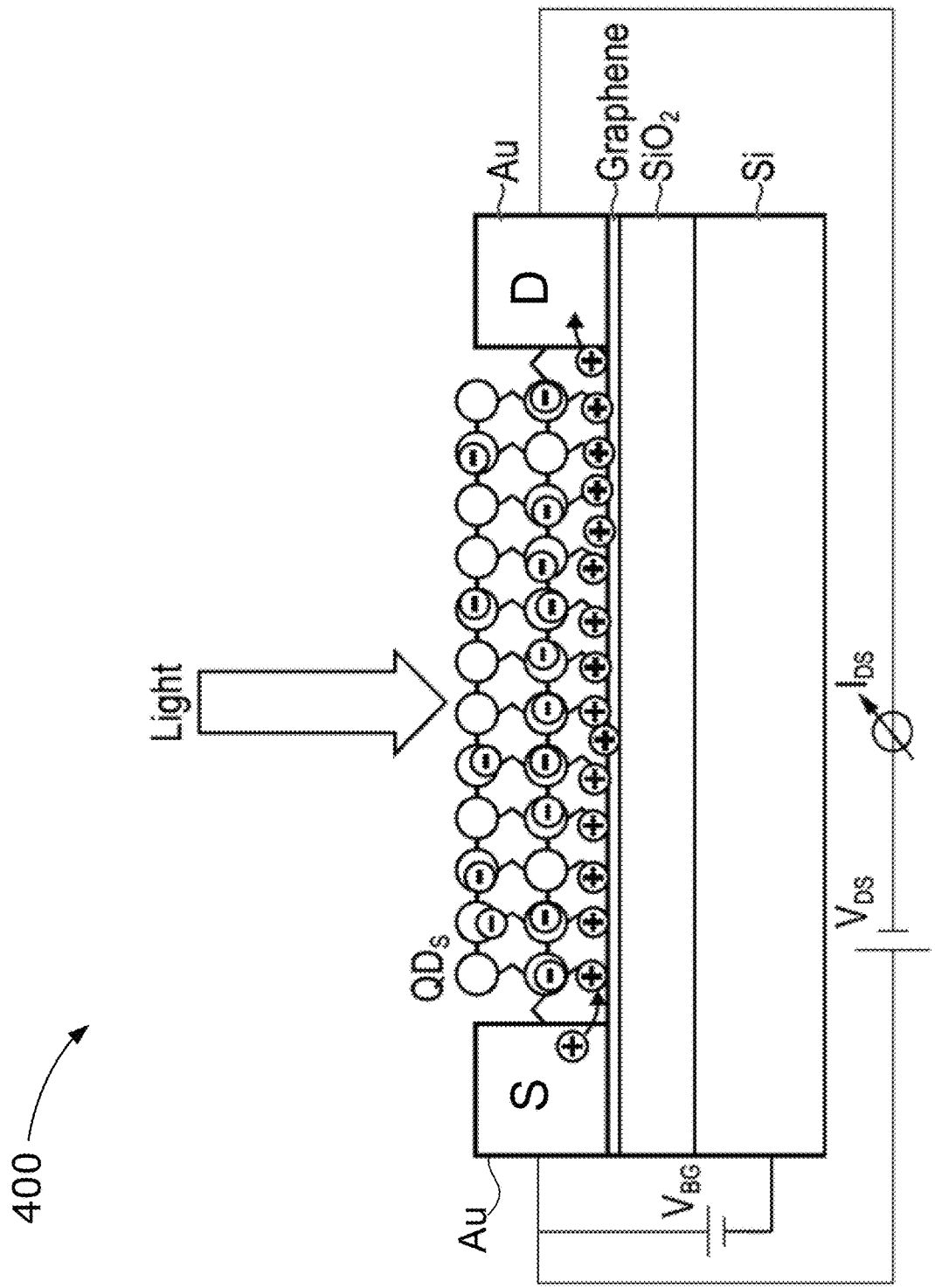

FIG. 4 shows a schematic of the graphene-quantum dot hybrid phototransistor 400, in which a graphene flake is deposited onto a Si and SiO2 structure and coated with PbS quantum dots. Incident photons create electron-hole pairs in the PbS quantum dots. Holes are then transferred to the graphene channel and drift towards the drain, but electrons remain in the PbS quantum dots, leading through capacitive coupling to a prolonged time during which (recirculated) carriers are present in the graphene channel, as described in Konstantatos G, et al., "Hybrid Graphene-Quantum Dot Phototransistors with Ultrahigh Gain". Nat Nanotechnol. 2012 May 6, which is herein incorporated by reference in its entirety.

Figure 5:
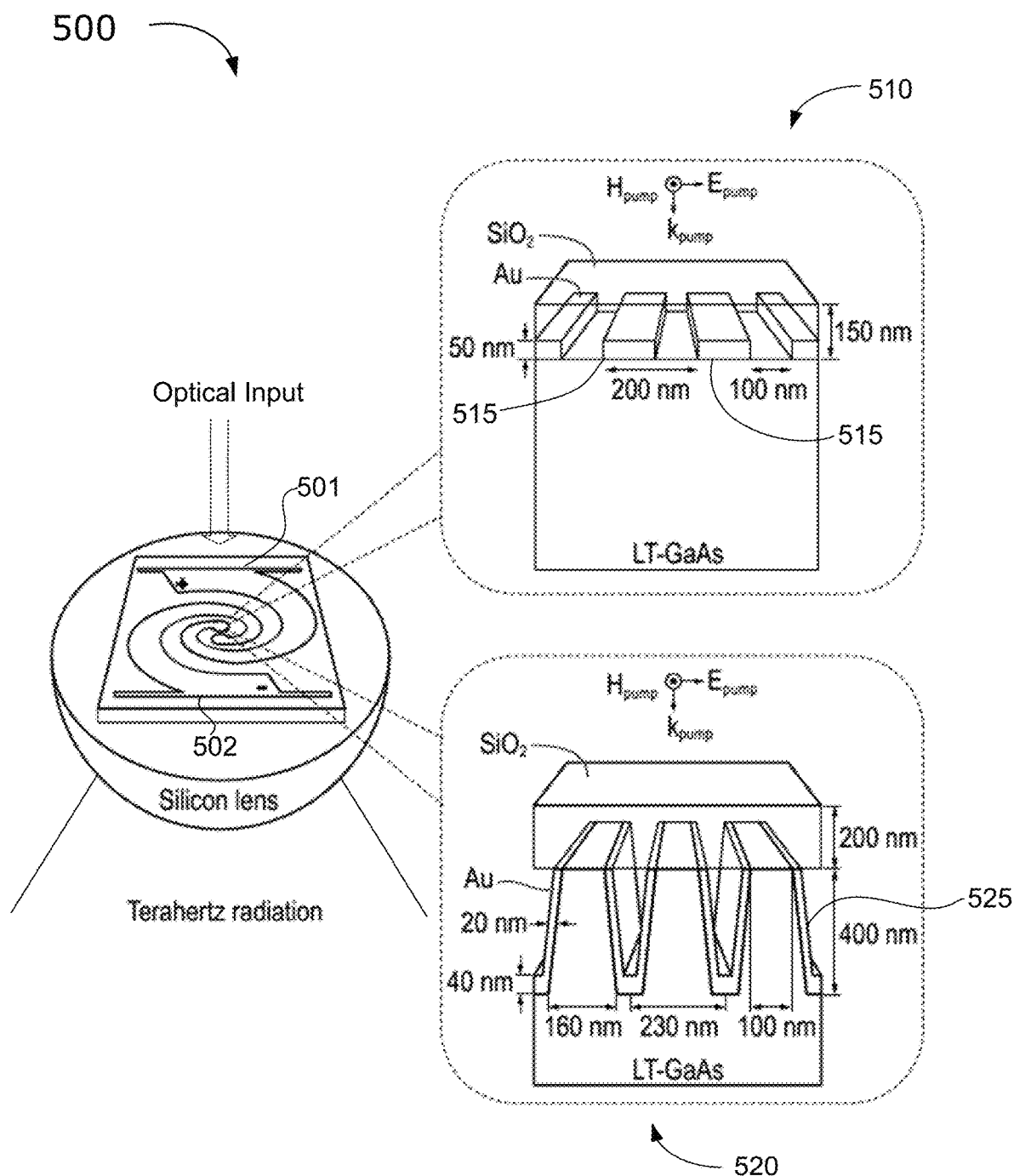

FIG. 5 illustrates a schematic diagram of a plasmonic photoconductive THz device 500 with a spiral antenna which has two components: a first half-spiral antenna 501 and a second half-spiral antenna 502. A cross section 510 of a first photoconductor configuration is shown to have two-dimensional (2D) plasmonic contact electrodes 515 made of gold (Au). A 2D electrode 515 may be 50 nm in thickness and 100 nm in width, and spaced 100 nm apart from adjacent electrodes 515. A cross section 520 of a second photoconductor configuration is shown to have three-dimensional (3D) plasmonic contact electrodes 525 made of gold (Au). A 3D contact electrode 525 may be 20 nm in thickness and 400 nm in height. A high-aspect ratio plasmonic grating can allow efficient optical pump transmission (optical input) into the nanoscale photoconductor active regions, localizing the majority of the photocarriers in close proximity to the contact electrodes. A logarithmic spiral antenna 501, 502 can be used as the THz radiating element to offer broadband radiation properties required for pulsed THz generation, as described in the online lecture by Mona Jarrahi (2015), "New Frontiers in Terahertz Technology," https://nanohub.org/resources/22228, which is herein incorporated by reference in its entirety.

Figure 6:
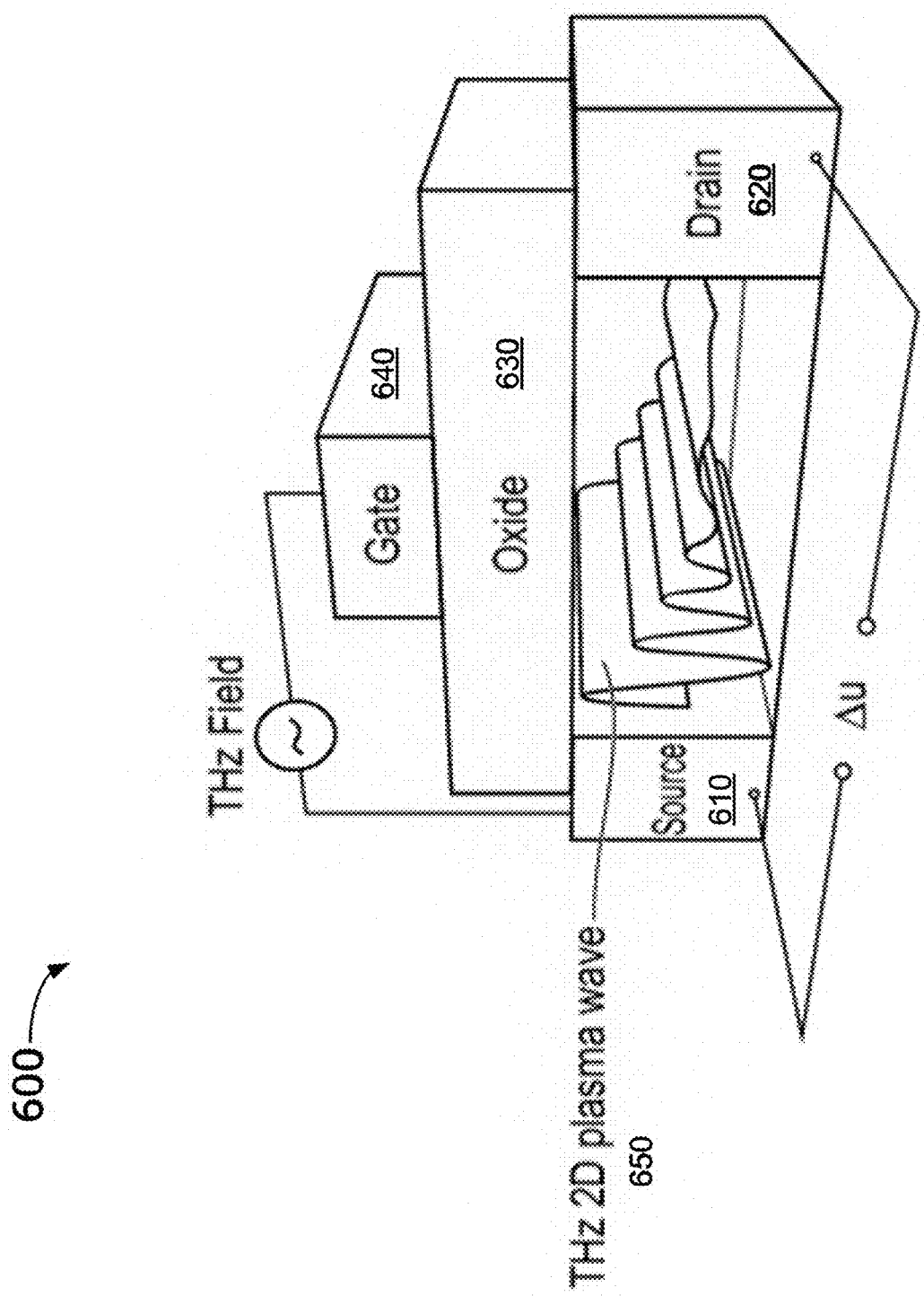
FIG. 6 illustrates an example graphene terahertz photodetector.

FIG. 6 illustrates an example graphene terahertz photodetector 600, which has a source component 610, a drain component 620, an oxide component 630 (e.g. silicon oxide) and a gate component 640. When an optical input (not shown) is received, THz radiation may occur at the antenna connected to the source component 610 and the gate component 640, and 2D THz plasma waves 650 may be generated. Plasmon waves are, generally speaking, electromagnetic (EM) oscillations. Surface plasmons (SPs) are coherent delocalized electron oscillations that exist at the interface between any two materials where the real part of the dielectric function changes sign across the interface (e.g. a metal-dielectric interface, such as a metal sheet in air). SPs have lower energy than bulk (or volume) plasmons which quantise the longitudinal electron oscillations about positive ion cores within the bulk of an electron gas (or plasma). In graphene, carriers (e.g., electrons and holes) have very high mobility and gate-tunable carrier densities. SPs excited in graphene are confined much more strongly than those in conventional noble metals, resulting in thinner constructions of antenna components.

Figure 7:
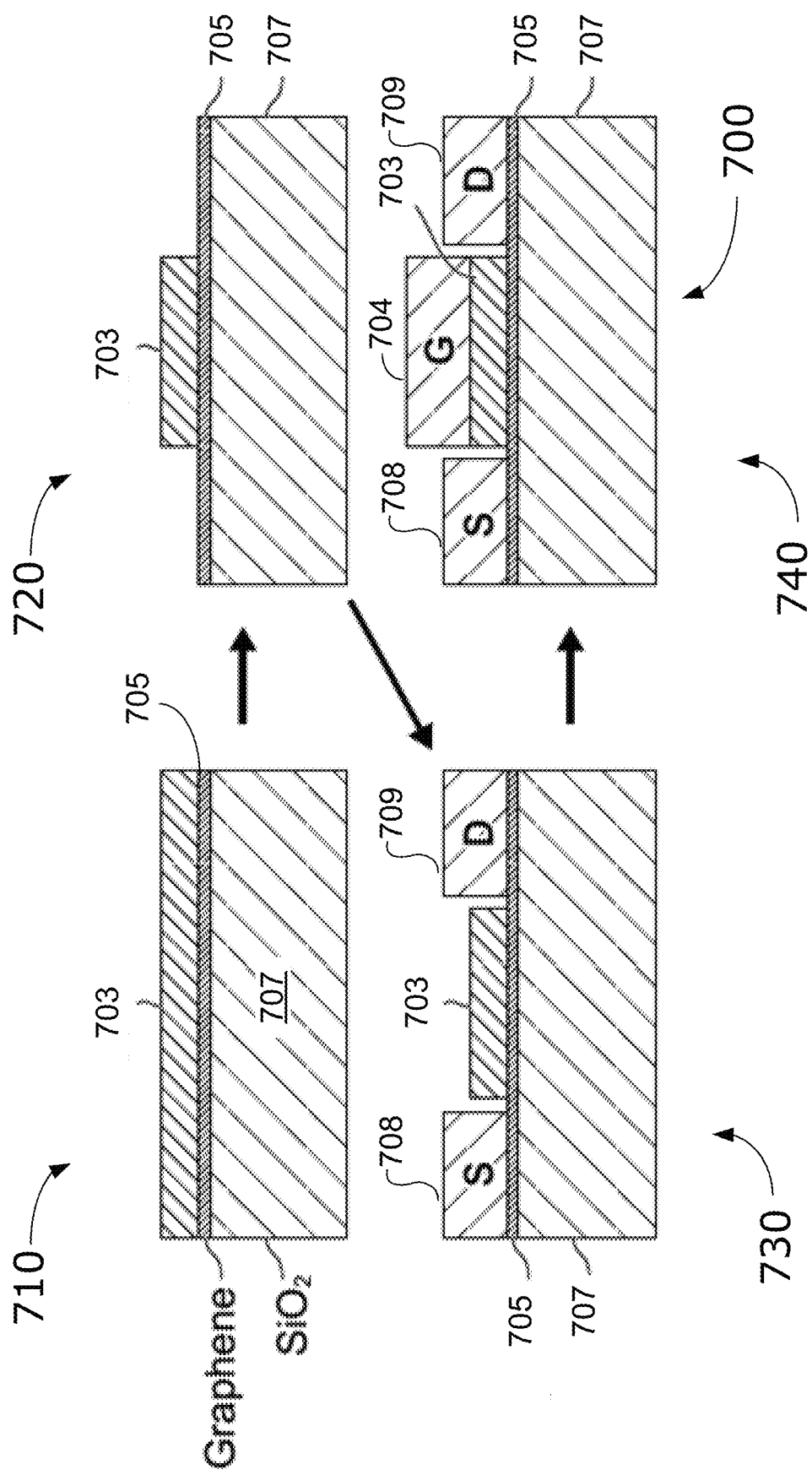
FIG. 7 illustrates a manufacturing process of an example graphene-based photodetector.

FIG. 7 illustrates a simplified manufacturing process of an example graphene-based photodetector 700. At step 710, a top layer 703, which may be made of aluminum oxide, is deposited on top of a graphene layer 705, which is deposited on top of a silicon oxide base layer 707. At step 720, the top layer 703 is reduced to an appropriate size. At step 730, a source component 708 and a drain component 709, both of which may be made of gold, are deposited on top of the graphene layer 705, with the source component 708 on one side of the top layer 703 and the drain component 709 on the other side of the top layer 703. At step 740, a gate layer 704 is deposited on the top layer 703 to form a complete graphene-based photodetector 700.

Figure 8A:
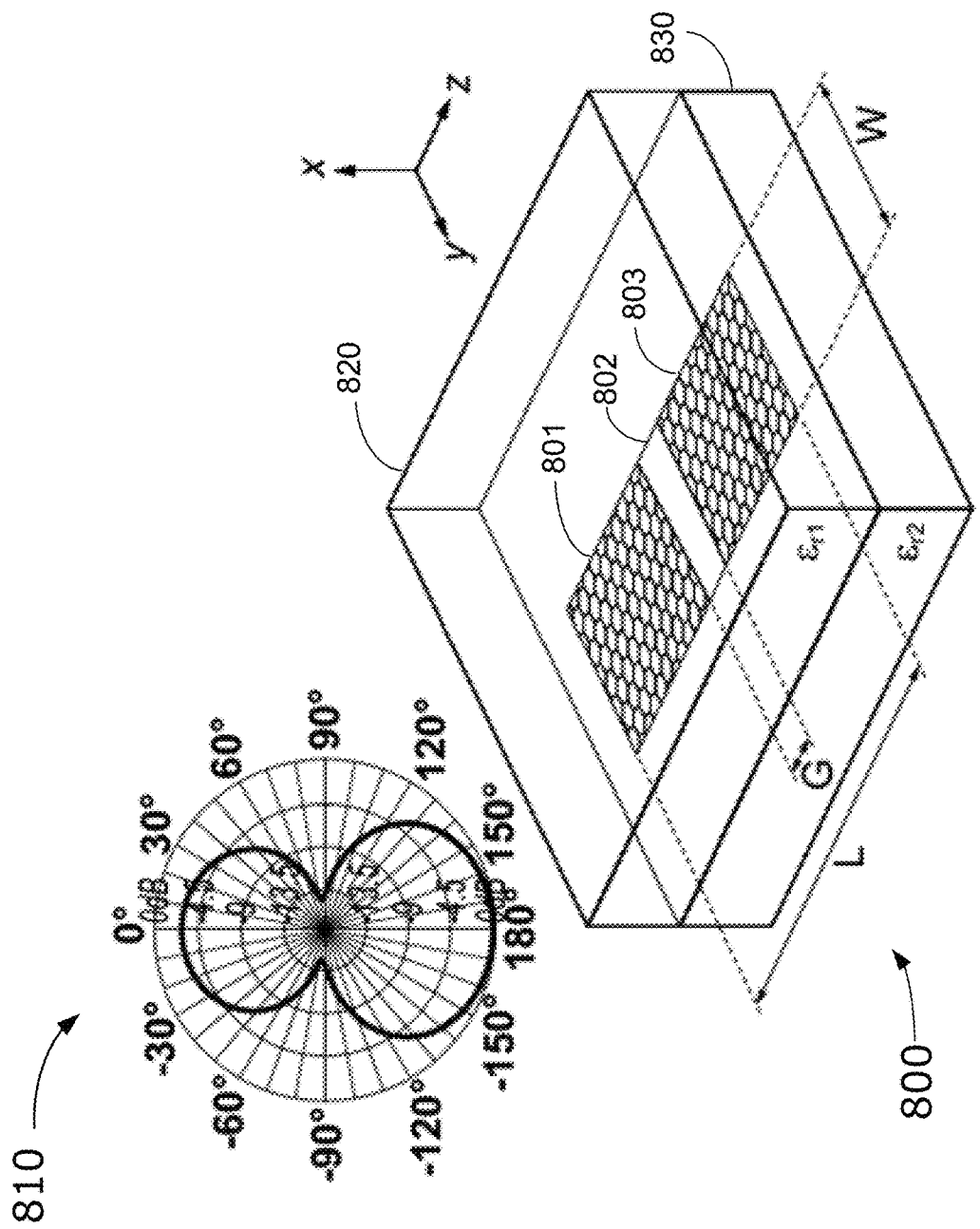
FIG. 8A illustrates a 3D schematic of a single layer graphene-based planar dipole and the E-plane radiation pattern.

FIG. 8A illustrates a 3D schematic of a single layer graphene-based planar dipole 800 and the E-plane radiation pattern 810, as shown in Correas-Serrano, D., & Gomez-Diaz, J. (2017). Graphene-based Antennas for Terahertz Systems: A Review. *arXiv: Mesoscale and Nanoscale Physics*, which is incorporated herein by reference in its entirety.

As illustrated, a graphene-based antenna 801, 803 are sandwiched between a first substrate layer 820 and a second substrate layer 830. The graphene-based antenna 801, 803 can be excited when an optical input (not shown) is received by the gap region 802. Graphene supports the propagation of surface plasmon polaritons (SPPs) able to exhibit strong wave localization, moderate loss, and the exceptional property of being tunable through electrical/magnetic bias or chemical doping. $\varepsilon_{r1}$ is the permittivity of substrate layer 820 and $\varepsilon_{r2}$ is the permittivity of substrate layer 830.

Figure 8B:
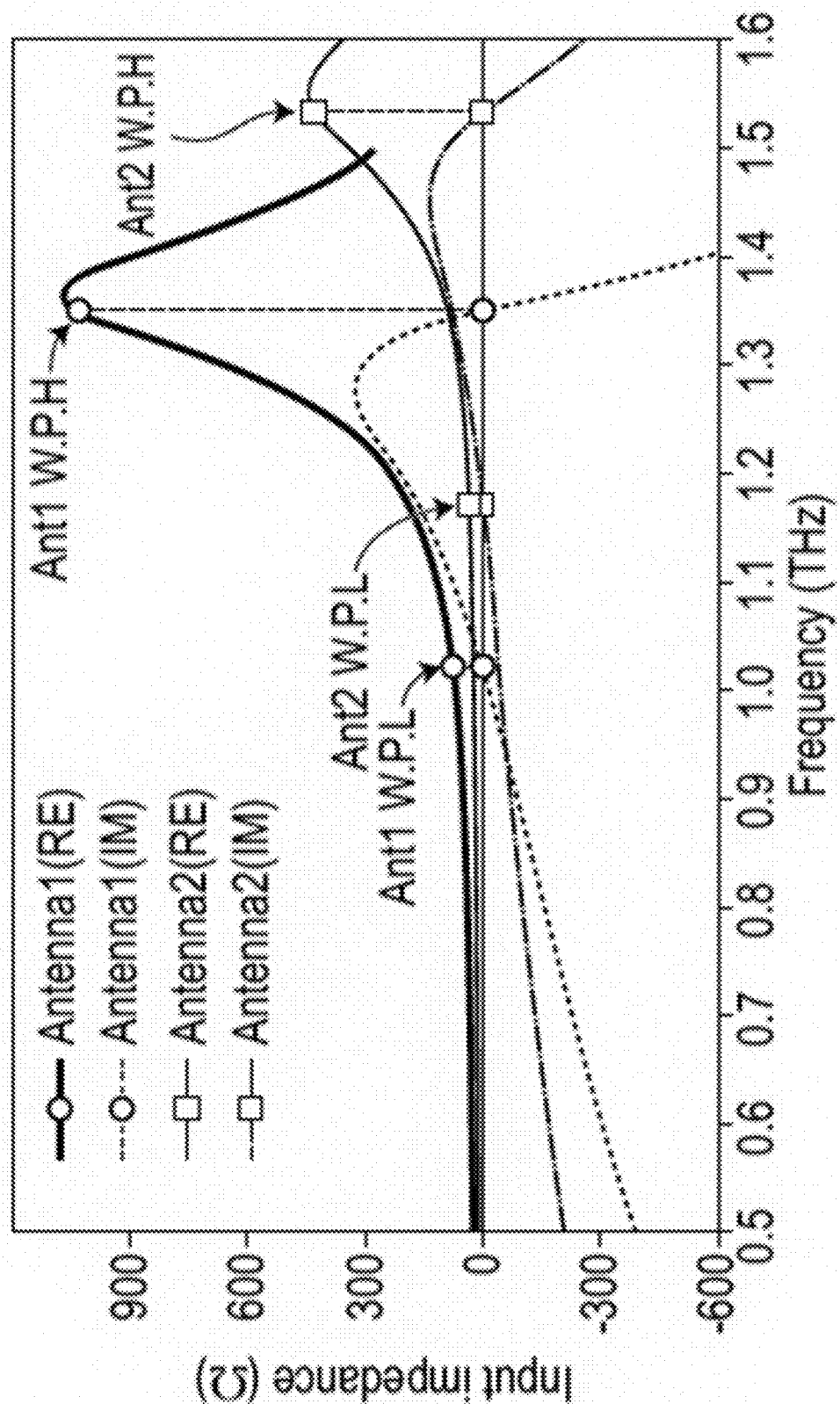
FIG. 8B illustrates the input impedance of the graphene dipoles in FIG. 8A.

FIG. 8B illustrates the input impedance of the graphene dipoles in FIG. 8A. the input impedance of a graphene dipole antenna tuned to $\mu_c$=0.13 and 0.25 eV, with $\mu_c$ being graphene's chemical potential. The frequency points suitable for operation as an antenna (i.e., real input impedance) are marked in the plot as W.P.L and W.P.H (working points low and high, respectively), corresponding to the conditions L≈0.5$\lambda_{SPP}$, and L≈$\lambda_{SPP}$ where $\lambda_{SPP}$ is the wavelength of the surface plasmon polariton (SPP) mode supported by the graphene strip 801, 803.

Figure 9:
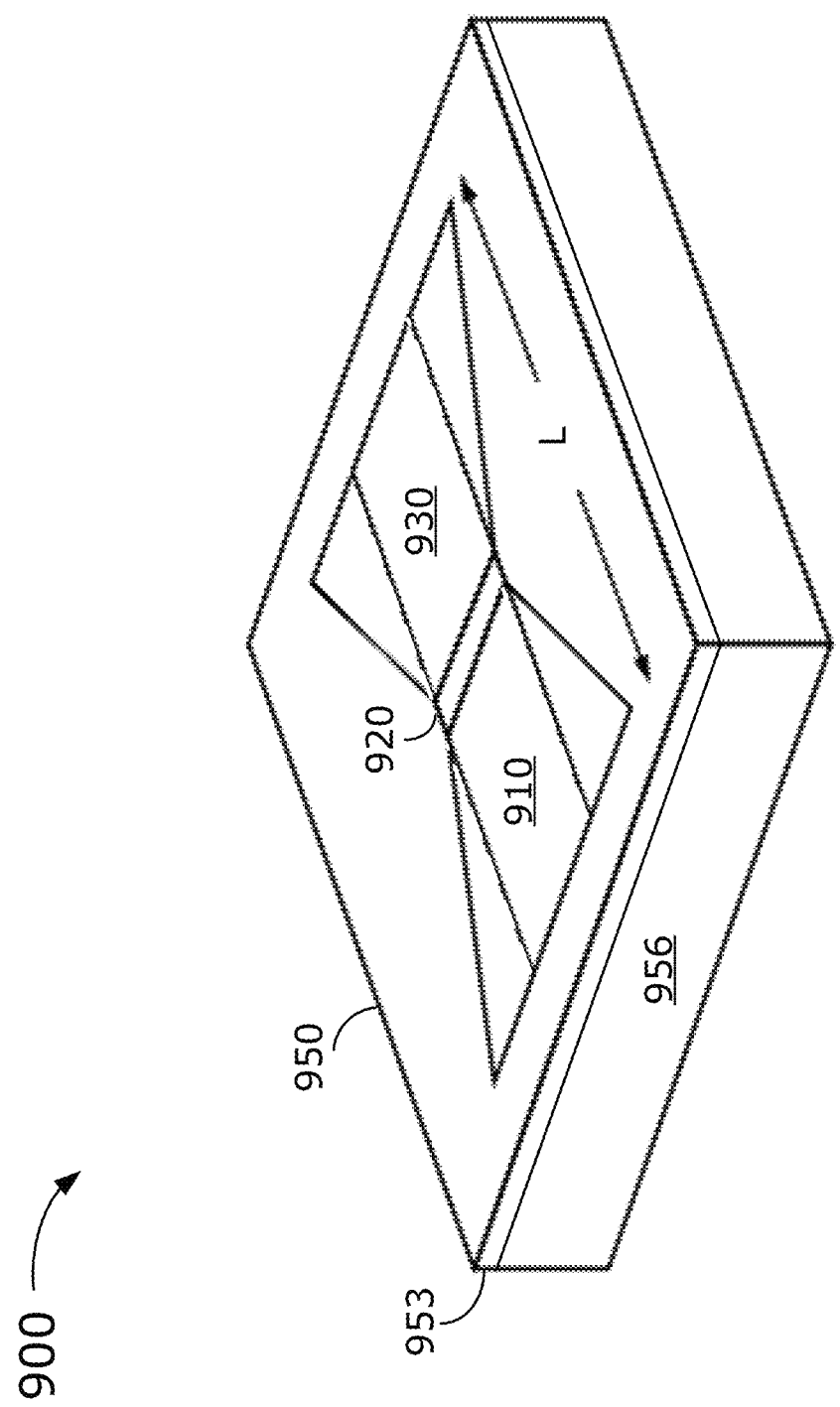
FIG. 9 illustrates an example graphene-based photodetector, in accordance with some example embodiments.

FIG. 9 illustrates an example graphene-based photodetector device 900, in accordance with some example embodiments. The proposed photodetector device 900 is flexible, transparent and tunable. In one example embodiment, the photodetector device 900 may include: a substrate 950, a first antenna component 910 deposited or fabricated on the substrate 950, a second antenna component 930 deposited or fabricated on the substrate 950. The first antenna component 910 and 930 each may include one or more antenna electrodes. A gap region 920 is left between the first antenna component 910 and the second antenna component 930, and on the substrate 950. The gap region 920 may be referred to as the gap 920. The one or more antenna electrodes in the first antenna component 910 and the second antenna component 930 may be made of graphene.

In some embodiments, the one or more antenna electrodes in the first antenna component 910 and the second antenna component 930 may be plasmonic contact electrodes. The first antenna component 910 and the second antenna component 930 may then behave as a scatterer whose properties strongly depend on materials in proximity of the gap 920, enabling sensing application at THz and infrared frequencies.

In some example embodiments, the plasmonic contact electrodes in the first antenna component 910 and the second antenna component 930 may be arranged in an arrangement or structure that has a plurality of electrodes spaced apart with relatively small spacing, which may be sub-wavelength. Plasmonic contact electrodes made of graphene may excite or cause propagation of surface plasmon waves or surface waves, and by coupling light to matter, photonic effects can be realised on a much smaller spatial scale, thereby improving optic-to-electrical efficiency of the photodetector 900, as compared to non-graphene based antenna electrodes.

In some example embodiments, the first antenna component 910 and the second antenna component 930 may be symmetrical, or may substantially form a bowtie shape, as illustrated in FIG. 9. The bowtie shape may have a length L, which can be half of a wavelength of the surface plasmon polaritons (SPPs) supported by the graphene antenna components 910, 930, that is, $L \approx 0.5\lambda_{SPP}$, where $\lambda_{SPP}$ is the wavelength of the SPPs supported by the graphene antenna components 910, 930. The length L may include a length the first antenna component 910, a length of the second antenna components 930, and a length of the gap 920. In general, the wavelength of the SPPs may depend on a number of factors, for example, on the properties of the material of the antenna (e.g. graphene in this case), the free space wavelength, and the properties of the dielectric material.

Generally speaking, the thicker the graphene-based antenna components 910, 930 are, the more conductive the photodetector 900 is. In some embodiments, a thickness of the first antenna component 910 may be less than 5 nm, and a thickness of the second antenna component 930 may be less than 5 nm.

Figure 2:
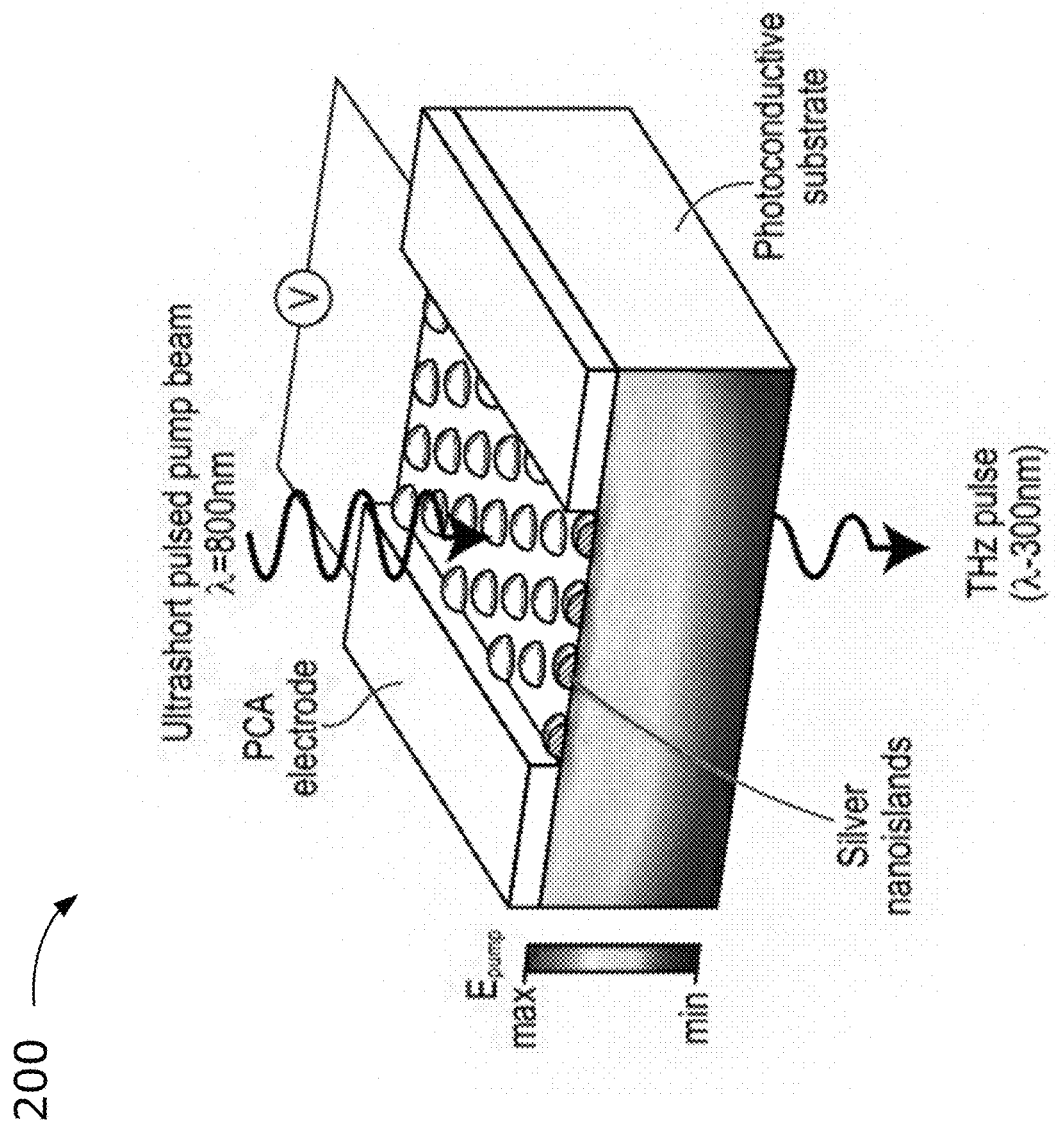
Figure 3:
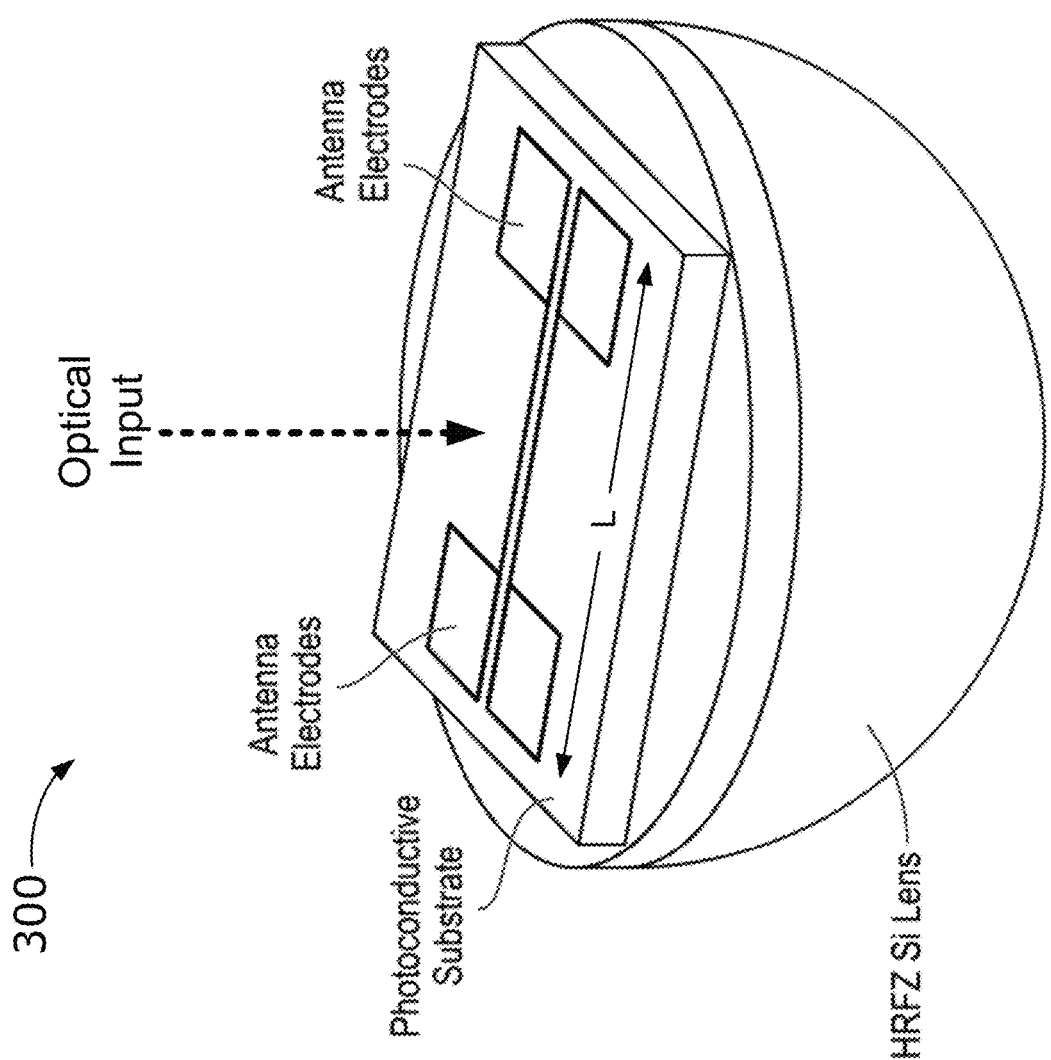

Compared to a conventional metal antenna electrode illustrated in FIGS. 1 to 3, the bowtie-shaped, graphene-based antenna 910, 930 may achieve a size reduction in the range of ⅓ to ¼, for example, it may achieve a size reduction of 33%, which enables the photodetector 900 to be worn on human bodies without inconveniencing the users. In addition, the bowtie shape may also maximize radiation efficiency of the first antenna component 910 and the second antenna component 930.

In some example embodiments, the substrate 950 may be a semiconductor substrate 950. In some example embodiments, the substrate 950 may be a photoconductive substrate 950. The substrate 950 may be made of silicon, for example, it may be made of silicon oxide.

In some example embodiments, the substrate 950 may include a top layer 953 and a base layer 956 underneath the top layer 953. In some example embodiments, the top layer 953 may include a material selected from: graphene, silicon, aluminum, silver, gold, gallium, indium, and germanium, or any combination thereof. As graphene is a photoconductive material, it can be used to make some or all of the top layer 953, in addition to being used to fabricate the first antenna component 910 and the second antenna component 930. When graphene is used to make both the top layer 953 and the first and second antenna components 910, 930, the resulting photodetector 900 can have better detecting ability and perform with a better optical-to-electrical efficiency. In addition, a graphene-based photodetector which has both the antenna components 910, 930 and the top layer 953 made of graphene tends to be easier to integrate and manufacture.

In some example embodiments, the top layer 953 may include a material made of a metal oxide selected from: aluminum oxide, and silicon oxide.

In some example embodiments, the base layer 956 may include a material made of silicon. It may be made of silicon oxide, as an example.

In some embodiments, a source region (not explicitly shown) may be coupled to the first antenna component 910 and the substrate 950, and a drain region (not explicitly shown) may be coupled to the second antenna component 930 and the substrate 950.

Figure 10:
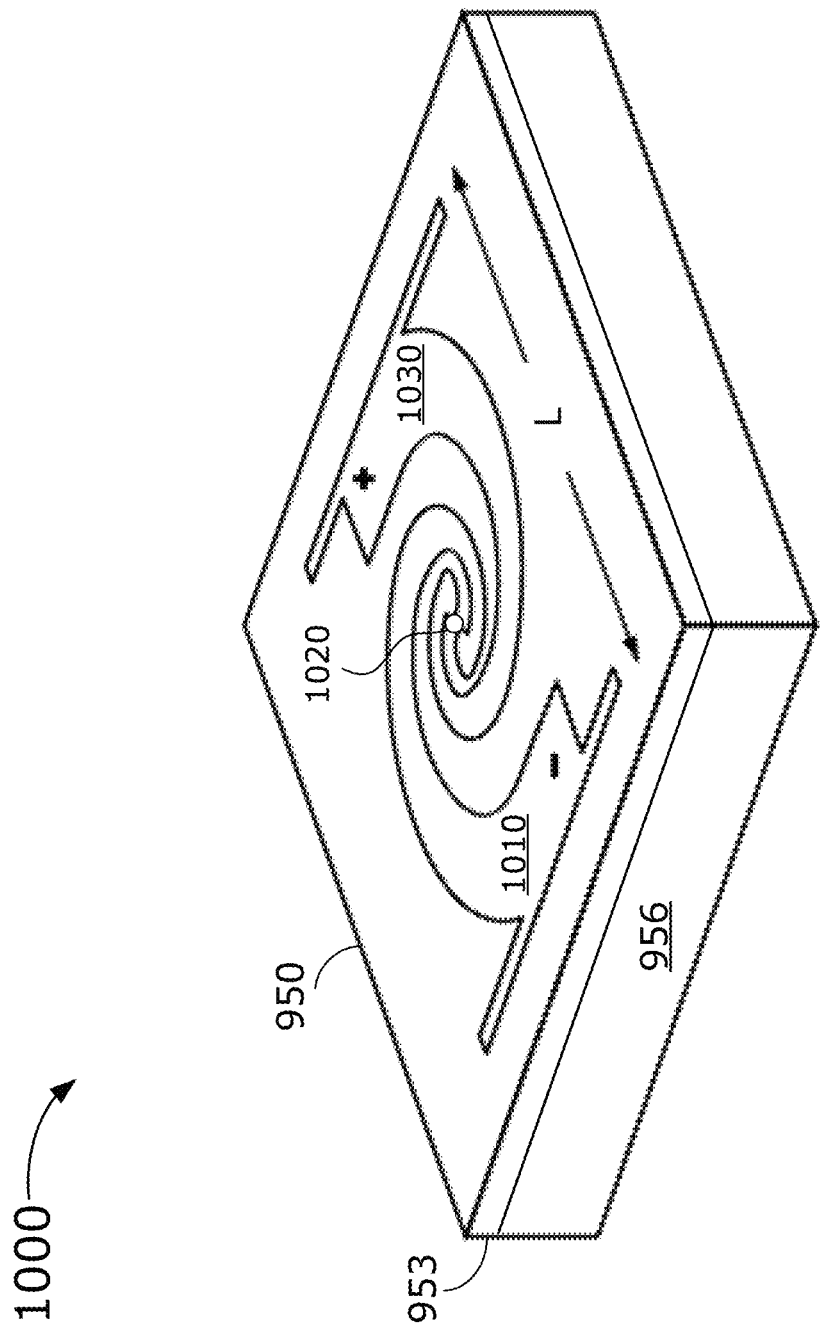
FIG. 10 illustrates another example graphene-based photodetector, in accordance with some example embodiments.

FIG. 10 illustrates another example graphene-based photodetector 1000, in accordance with some example embodiments. In this example, the first antenna component 1010 and the second antenna component 1030 substantially form a spiral shape, fabricated on a substrate 950. A gap region 1020 may be deposited on the substrate 950 between the first antenna component 1010 and the second antenna component 1030.

In some embodiments, the one or more antenna electrodes in the first antenna component 1010 and the second antenna component 1030 may be plasmonic contact electrodes.

The spiral shape may have a length L, which can be half of a wavelength of the surface plasmon polaritons (SPPs) supported by the graphene antenna components 1010, 1030, that is, $L \approx 0.5\lambda_{SPP}$, where $\lambda_{SPP}$ is the wavelength of the SPPs supported by the graphene antenna components 1010, 1030. In general, the wavelength of the SPPs may depend on a number of factors, for example, on the properties of the material of the antenna (e.g. graphene in this case), the free space wavelength, and the properties of the dielectric material.

Generally speaking, the thicker the graphene-based antenna components 1010, 1030 are, the more conductive the photodetector 1000 is.

Compared to a conventional metal antenna electrode illustrated in FIGS. 1 to 3, the spiral-shaped, graphene-based antenna 910, 930 may achieve a size reduction in the range of ⅓ to ¼, for example, it may achieve a size reduction of 33%, which enables the photodetector 1000 to be worn on human bodies without inconveniencing the users. In addition, the spiral shape may also maximize radiation efficiency of the first 1010 and the second 1030 antenna component.

In some example embodiments, the plasmonic contact electrodes in the first antenna component 1010 and the second antenna component 1030 may be arranged in an arrangement or structure that has a plurality of electrodes spaced apart with relatively small spacing, which may be sub-wavelength. Plasmonic contact electrodes made of graphene may excite or cause propagation of surface plasmon waves or surface waves, and by coupling light to matter, photonic effects can be realised on a much smaller spatial scale, thereby improving optic-to-electrical efficiency of the photodetector 1000, as compared to non-graphene based antenna electrodes.

In some example embodiments, the substrate 950 may be a semiconductor substrate 950. In some example embodiments, the substrate 950 may be a photoconductive substrate 950. The substrate 950 may be made of silicon, for example, it may be made of silicon oxide.

In some example embodiments, the substrate 950 may include a top layer 953 and a base layer 956 underneath the top layer 953. In some example embodiments, the top layer 953 may include one or more material selected from: graphene, silicon, aluminum, silver, gold, gallium, indium, and germanium. As graphene is a photoconductive material, it can be used to make some or all of the top layer 953, in addition to being used to make the first antenna component 1010 and the second antenna component 1030. When graphene is used to make both the top layer 953 and the first and second antenna components 1010, 1030, the resulting photodetector 1000 can have better detecting ability and perform with a better optical-to-electrical efficiency. In addition, a graphene-based photodetector which has both the antenna components 1010, 1030 and the top layer 953 made of graphene tends to be easier to integrate and manufacture.

In some example embodiments, the top layer 953 may include a material made of a metal oxide selected from: aluminum oxide, and silicon oxide.

In some example embodiments, the base layer 956 may include a material made of silicon. It may be made of silicon oxide, as an example.

In some embodiments, a source region (not explicitly shown) may be coupled to the first antenna component 1010 and the substrate 950, and a drain region (not explicitly shown) may be coupled to the second antenna component 1030 and the substrate 950.

In some example embodiments, the photodetector device 900, 1000 may be configured to receive optical light at the gap 920, 1020 between the first antenna component 910, 1010 and the second antenna component 930, 1030, and generate a current in the substrate 950 as a result of receiving the optical light. In some example embodiments, the wavelength of the optical light may be in a frequency range from about 0.1 THz to 10 THz.

When a light input is received, such as from a light pump, the one or more antenna electrodes in the first antenna component 910, 1010 and the second antenna component 930, 1030 may cause excitement or propagation of plasmon waves between the source region and the drain region.

Further, when applied with appropriate bias voltage, the resonance of the photodetector 900, 1000 can be dynamically tuned at a wide frequency range.

In some embodiments, the resonance behavior of the graphene-based photodetector 900, 1000 can be changed by applying a bias voltage, which can be changed through an analog or digital controller that controls the applied voltage on the graphene-based antenna electrodes on the first 910, 1010 or second 930, 1030 antenna component. This can be done because of a special conductive property of the graphene, that is, a bias voltage can change its conductivity and therefore resonant behavior. The frequency can be tuned while the photodetector 900, 1000 is in use, just by changing the imposed bias voltage.

Figure 11:
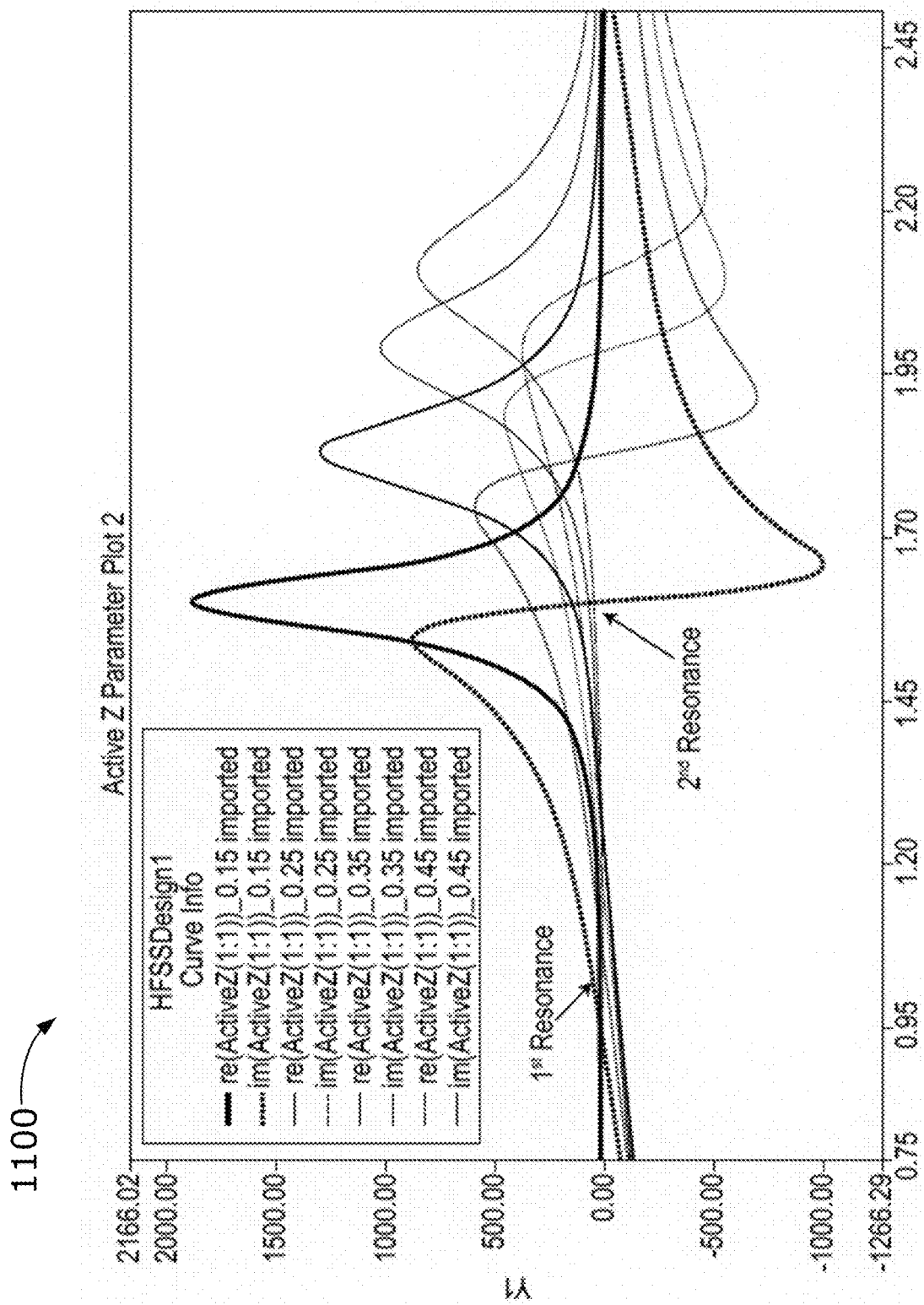
FIG. 11 illustrates an input impedance plot graph of the graphene-based photodetector in FIG. 9.

FIG. 11 illustrates an input impedance plot graph 1100 of the graphene-based photodetector in FIG. 9. X-axis has values representing the frequency in THz, and Y-axis has values representing the impedance (real and imaginary) in ohm. As illustrated, by changing the bias voltage, the input impedance of the photodetector 900 changes, from a first resonance at approximately 1 THz (between 0.95 THz and 1.2 THz) to a second resonance at approximately 1.6 THz (between 1.45 THz and 1.7 THz).

In some example embodiments, the photodetector 900, 1000 may further include, or be connected to, a power detector configured to detect a voltage difference between the drain region and the source region of the photodetector 900, 1000.

Figure 12:
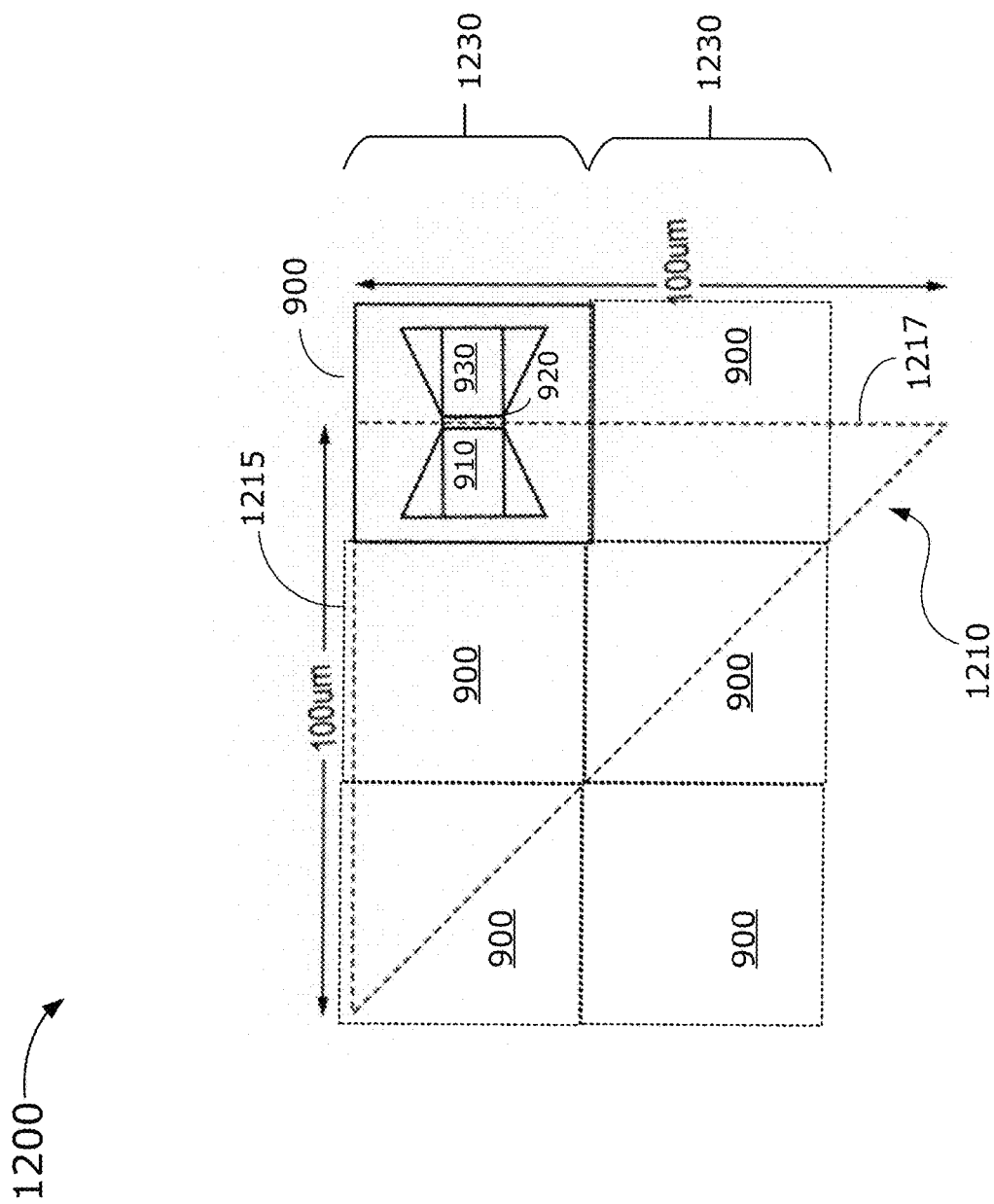
FIG. 12 shows a simplified top view of the example graphene-based photodetector in FIG. 9.

FIG. 12 shows a simplified top view 1200 of the example graphene-based photodetector 900 when in use. One or more graphene-based photodetector(s) 900 may be deployed to detect a metal object 1210, which may be placed above the photodetector(s) 900. The metal object 1210 may have, for example, a triangular shape. The metal object 1210 may have any size, though in FIG. 12 it is illustrated with a first side 1215 having a length of 100 um and a second side 1217 having a length of 100 um. A portion of the metal object 1210, such as the second side 1217 of the metal object 1210, may be in close proximity with the photodetector 900.

In some embodiments, the light reflected or scattered by the metal object 1210 may enter the gap 920 between the first antenna component 910 and the second antenna component 930 of the photodetector 900, thereby exciting the electrons in the photodetector 900 to generate a current, which can be measured in order to measure the intensity of the light reflected by the metal object 1210. Since metal generally reflects light, measuring the current in the photodetector 900 is a means to measure the light reflected by the metal object 1210, thereby determining that metal exists in the object 1210.

In some embodiments, in order to measure the metal object 1210 in an efficient manner, multiple photodetectors 900 may be arranged in one or more arrays 1230 to receive reflected light from the metal object 1210. In this example, each photodetector 900 in the one or more arrays 1230 may scan a portion of the metal object 1210 and generate a corresponding current based on the received reflected light from the respective portion of the metal object 1210. Each photodetector 900 may then generate an individual heat map based on the generated corresponding current for the respective portion of the metal object 1210. For example, a main colour in the heat map may indicate a level of the corresponding current generated based on the received reflected light from the respective portion of the metal object 1210. Piecing together all the heat maps from all the photodetectors 900, a composite heat map may be obtained, in which different colours in the composite heat map can show varying (or consistent) levels of detected metal from the metal object 1210.

Figure 13:
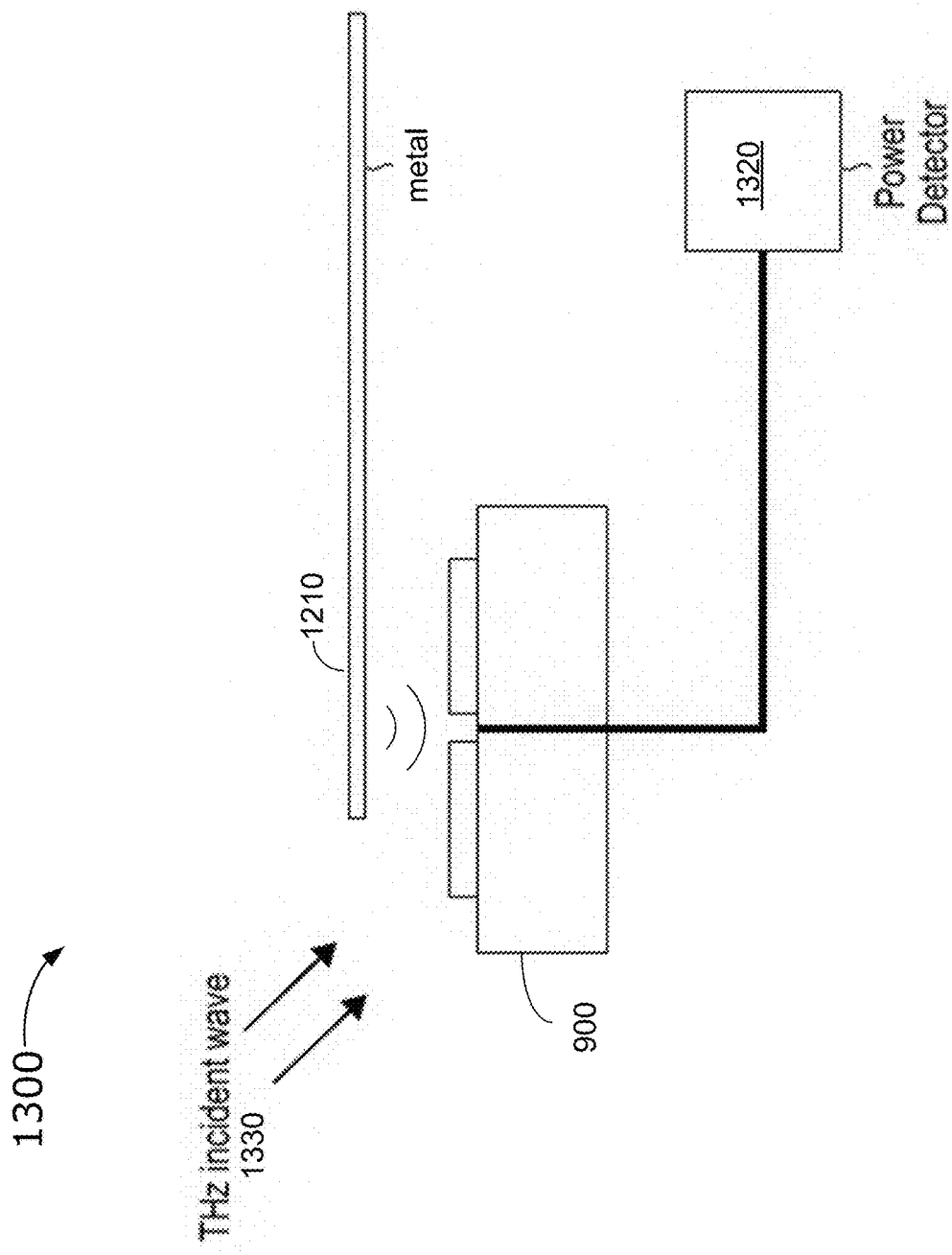
FIG. 13 illustrates a simplified side view of the example graphene-based photodetector in FIG. 9 when in use.

FIG. 13 illustrates a simplified side view 1300 of the example graphene-based photodetector 900 in FIG. 12. The photodetector 900 is connected with a power detector 1320, and is placed in close proximity, such as placed under the metal object 1210. The power detector 1320 can measure the square of current, i.e., the power change at certain frequencies.

THz incident waves 1330 may be sent to illuminate the photodetector 900, in which case the photodetector 900 acts like a receiving antenna. When the photodetector 900 has a metal object 1210 in its near field region, a resonance shift may occur. In some embodiments, natural light may act as THz incident waves 1330. In other embodiments, an external THz source, such as a THz signal generator, (not explicitly shown) may generate the THz incident waves 1330.

When the metal object 1210 is present, the resonance of the photodetector 900 is shifted. This resonance shift may show in the form of current change at certain frequencies, which can be captured by the power detector 1320 as a power change at those frequencies.

In some embodiments, the photodetector 900 may perform the scanning process of the metal object 1210 in incremental steps when the metal object 1210 is larger than the scanning area of the photodetector 900. For example, the photodetector 900 may be placed at a different location relative to the metal object 1210 in each step, in order to make scan the entire metal object 1210.

Figure 14:
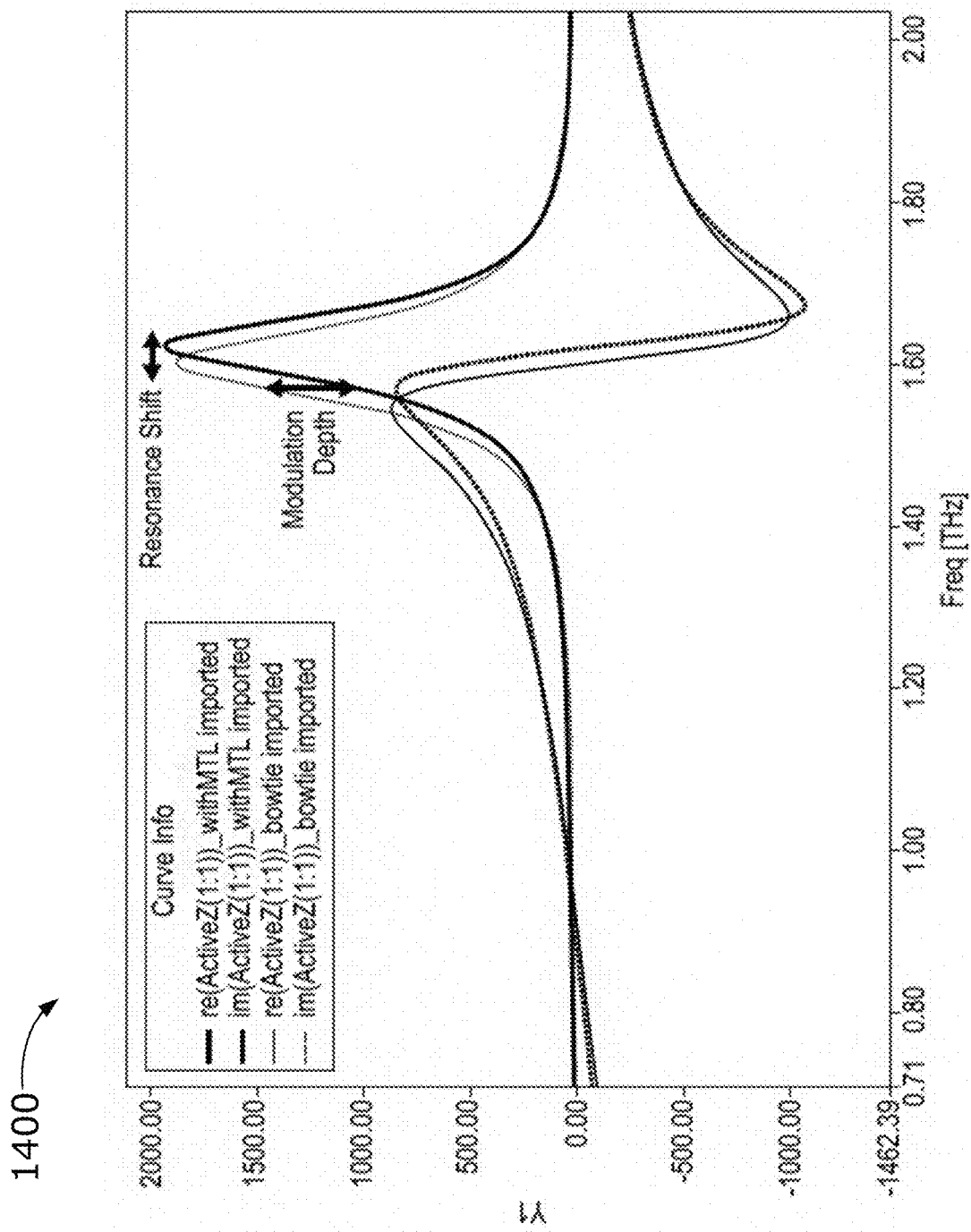
FIG. 14 shows a plot diagram of the resonance shift and the modulation depth of the graphene-based photodetector in FIGS. 12 and 13.

FIG. 14 shows a plot diagram 1400 of the resonance shift and the modulation depth of the graphene-based photodetector 900 in FIGS. 12 and 13. The diagram 1400 shows the resonance shifts with the presence of metal object 1210 in close proximity of the photodetector 900. The graph 1400 can be used to determine the shape of the object 1210 to be imaged. The resonance shift can be recorded by the power detector 1320 as signal recorder. X-axis has values representing the frequency in THz, and Y-axis has values representing the impedance (real and imaginary) in ohm. As illustrated, there is a resonance shift between 1.6 THz and 1.8 THz, caused by the metal object 1210 being in close proximity with the photodetector 900.

Certain adaptations and modifications of the described embodiments can be made. Therefore, the above discussed embodiments are considered to be illustrative and not restrictive. Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A photodetector device comprising:
a substrate;
a first graphene-based antenna component fabricated on the substrate,
the first graphene-based antenna component comprising one or more graphene antenna electrodes;
a second graphene-based antenna component fabricated on the substrate,
the graphene-based second antenna component comprising one or more graphene antenna electrodes;
a source region coupled to the first graphene-based antenna component and the substrate; and
a drain region coupled to the second graphene-based antenna component and the substrate;
wherein a thickness of the first or second graphene-based antenna component is less than 5 nm.

2. The device of claim 1, wherein the first graphene-based antenna component and the second graphene-based antenna component form a bowtie shape.

3. The device of claim 1, wherein the first graphene-based antenna component and the second graphene-based antenna component form a spiral shape.

4. The device of claim 1, wherein a gap is disposed between the first graphene-based antenna component and the second graphene-based antenna component.

5. The device of claim 4, wherein the device is configured to:
receive optical light via the gap between the first graphene-based antenna component and the second graphene-based antenna component; and
generate a current in the substrate as a result of receiving the optical light.

6. The device of claim 5, wherein the one or more graphene antenna electrodes in the first graphene-based antenna component and the second graphene-based antenna component cause excitement or propagation of plasmon waves between the source region and the drain region.

7. The device of claim 5, wherein the wavelength of the optical light is in a frequency range from about 0.1 THz to 10 THz.

8. The device of claim 1, further comprising:
a gate region disposed between the drain region and the source region.

9. The device of claim 1, wherein the substrate is a semiconductor substrate.

10. The device of claim 9, wherein the substrate comprises a top layer and a base layer underneath the top layer.

11. The device of claim 10, wherein the top layer comprises one or more material selected from: graphene, silicon, aluminum, silver, gold, gallium, indium, and germanium.

12. The device of claim 11, wherein the top layer comprises a material made of a metal oxide selected from: aluminum oxide, and silicon oxide.

13. The device of claim 9, wherein the substrate is a photoconductive substrate.

14. The device of claim 10, wherein the base layer comprises a material made of silicon.

15. The device of claim 1, further comprising:
a power detector configured to detect a voltage difference between the drain region and the source region.

16. The device of claim 1, wherein the first graphene-based antenna component and the second graphene-based antenna component have a combined length that is equal to or less than half of a wavelength of surface plasmon polaritons (SPPs) supported by the first graphene-based antenna component and the second graphene-based antenna component.

17. The device of claim 16, wherein the first graphene-based antenna component has a length that is equal to or less than ¼ of the wavelength of the SPPs supported by the first graphene-based antenna component.

18. The device of claim 16, wherein the second graphene-based antenna component has a length that is equal to or less than ¼ of the wavelength of the SPPs supported by the second graphene-based antenna component.

19. A system comprising a plurality of photodetector devices arranged in one or more arrays to detect a metal object,
wherein each photodetector device comprises:
a substrate;
a first graphene-based antenna component fabricated on the substrate,
the first graphene-based antenna component comprising one or more graphene antenna electrodes;
a second graphene-based antenna component fabricated on the substrate,
the second graphene-based antenna component comprising one or more graphene antenna electrodes;
a source region coupled to the first graphene-based antenna component and the substrate; and
a drain region coupled to the second graphene-based antenna component and the substrate;
wherein a thickness of the first or second graphene-based antenna component is less than 5 nm.

* * * * *